United States Patent
Seog et al.

(10) Patent No.: US 10,600,661 B2
(45) Date of Patent: Mar. 24, 2020

(54) RAPID HEAT TREATMENT APPARATUS

(71) Applicant: ULTECH CO., LTD., Daegu (KR)

(72) Inventors: Changgil Seog, Daegu (KR);
Daeyoung Kong, Daegu (KR);
Mungyu Song, Daegu (KR); Kyuchul Seo, Daegu (KR)

(73) Assignee: ULTECH CO., LTD., Daegu (KR)

(*) Notice: Subject to any disclaimer, the term of this patent is extended or adjusted under 35 U.S.C. 154(b) by 359 days.

(21) Appl. No.: 15/574,812

(22) PCT Filed: Mar. 11, 2016

(86) PCT No.: PCT/KR2016/002436
§ 371 (c)(1),
(2) Date: Nov. 16, 2017

(87) PCT Pub. No.: WO2016/186302
PCT Pub. Date: Nov. 24, 2016

(65) Prior Publication Data
US 2018/0144955 A1 May 24, 2018

(30) Foreign Application Priority Data
May 20, 2015 (KR) .................. 10-2015-0070619

(51) Int. Cl.
*H01L 21/67* (2006.01)
*H01L 21/683* (2006.01)
(Continued)

(52) U.S. Cl.
CPC ... *H01L 21/67098* (2013.01); *G05D 23/1917* (2013.01); *H01L 21/67115* (2013.01);
(Continued)

(58) Field of Classification Search
CPC ......... H01L 21/67098; H01L 21/67115; H01L 21/67248; H01L 21/683; G05D 23/1917; H05B 3/0047
(Continued)

(56) References Cited

U.S. PATENT DOCUMENTS 6,311,016 B1 * 10/2001 Yanagawa ................ G01K 1/20
392/416
6,579,731 B2 6/2003 Yun
(Continued)

FOREIGN PATENT DOCUMENTS

JP 2002-170775 A 6/2002
JP 2002-353111 A 12/2002
(Continued)

OTHER PUBLICATIONS

PCT International Search Report, PCT/KR2016/002436, dated May 30, 2016, 4 Pages.

*Primary Examiner* — Jennifer C Chiang
(74) *Attorney, Agent, or Firm* — Fenwick & West LLP (57) ABSTRACT

A rapid heat treatment apparatus comprises: a chamber for rapid heat treatment; a support stage radiating light to rapidly heat a substrate for rapid heat treatment; a substrate for temperature measurement which is made of a same material as the substrate for rapid heat treatment; a thermocouple for temperature measurement measuring a temperature of the substrate for temperature measurement; a support part formed of a light-transmitting material that supports the substrate for temperature measurement; and a light-transmitting plate disposed between the support part and the heat source device to isolate the opposite internals spaces of the chamber from each other, wherein the temperature of the substrate for temperature measurement, which is measured
(Continued)

by the thermocouple, is considered to be the temperature of the substrate subjected to rapid heat treatment.

15 Claims, 6 Drawing Sheets

(51) Int. Cl.
 *G05D 23/19* (2006.01)
 *H05B 3/00* (2006.01)

(52) U.S. Cl.
 CPC ...... *H01L 21/67248* (2013.01); *H01L 21/683* (2013.01); *H05B 3/0047* (2013.01)

(58) Field of Classification Search
 USPC ...................................................... 219/444.1
 See application file for complete search history.

(56) References Cited

U.S. PATENT DOCUMENTS

| | | | |
|---|---|---|---|
| 6,798,036 B2 | 9/2004 | Yun | |
| 7,283,734 B2* | 10/2007 | Kubo | ................ H01L 21/67115 392/411 |
| 2002/0068371 A1 | 6/2002 | Yun | |
| 2003/0206574 A1 | 11/2003 | Yun | |
| 2017/0365493 A1* | 12/2017 | Zhang | ................ H05B 1/0233 |

FOREIGN PATENT DOCUMENTS

| | | |
|---|---|---|
| JP | 2015-046428 A | 3/2015 |
| KR | 10-2002-0019016 A | 3/2002 |
| KR | 10-2002-0026344 A | 4/2002 |
| KR | 10-0337107 B1 | 5/2002 |
| KR | 10-0395662 B1 | 8/2003 |
| KR | 10-0423184 B | 3/2004 |
| KR | 10-1097718 B1 | 12/2011 |
| WO | WO 00/66987 | 11/2000 |

\* cited by examiner

RAPID HEAT TREATMENT APPARATUS

TECHNICAL FIELD

The present disclosure relates to a rapid heat treatment apparatus, and more particularly, to a rapid heat treatment apparatus for measuring the temperature of a substrate that is being subjected to rapid heat treatment accurately in a non-contact manner.

Furthermore, the present disclosure is an invention developed under support of National Research and Development Project, and information of National Research and Development Project that supports the present disclosure is as follow:

[Project Series Number] 10048649
[Government Department Name] Ministry of Trade, Industry and Energy
[Research Administration Authority Name] Korea Evaluation Institute of Industrial Technology
[Research Program Name] Core industrial technology development program
[Research Project Name] Development of low temperature (50° C. or less) dry-type surface treatment technology of toxic gas sensor electrode with animal cilia structure inspired open junction network structure
[Agency] ULTECH CO., LTD.
[Period of Research] Jun. 1, 2015 to May 31, 2016

BACKGROUND ART

With the movement toward higher integration of semiconductor devices and larger scale of substrates, there is an increasing demand for a reduction in production costs of semiconductor devices. To meet the demand, a heat treatment process, in particular, a rapid heat treatment process is mainly used.

The rapid heat treatment process requires the precise control of the temperature of a substrate because the temperature of the substrate increases and decreases in a relatively wide temperature range for a very short time. Furthermore, to perform the rapid heat treatment process while maintaining a uniform temperature distribution of the substrate, it is necessary to maintain constant thermal properties over the entire area of the substrate. To achieve temperature uniformity over the entire area of the substrate, it is necessary to appropriately arrange lamps for heating the substrate and appropriately control the power supplied to each lamp to form a uniform heat flux over the entire area of the substrate. However, because there are many parameters including an amount and flow of gas introduced into a chamber for rapid heat treatment process and an internal structure of the chamber below and beside the substrate and these parameters are variable, it is not easy to ensure temperature uniformity over the entire area of the large scale substrate through only optimization of hardware type chamber design.

Accurately measuring the temperature of the large-scale substrate in the chamber for rapid heat treatment process is recognized as an important factor determining the reliability of the rapid heat treatment process and quality of semiconductor devices. A method for measuring the temperature of the substrate in the chamber for rapid heat treatment process is classified into a contact type and a non-contact type according to whether the substrate contacts temperature measuring means, and to prevent damage of the substrate caused by the contact between the temperature measuring means and the substrate, a non-contact temperature measurement method is mainly used. Furthermore, to obtain uniform process properties over the entire area of the substrate, a rotary rapid heat treatment apparatus that rotates the substrate in the chamber for rapid heat treatment process during the rapid heat treatment process is mainly used, rather than a fixed rapid heat treatment apparatus that does not horizontally rotate the substrate and fixes the substrate. Examples of the substrate temperature measurement method applied to the non-contact rapid heat treatment apparatus are disclosed by Korean Patent No. 10-0337107 (Patent Literature 1), Korean Patent No. 10-0395662 (Patent Literature 2), Korean Patent Publication No. 10-2002-0019016 (Patent Literature 3), Korean Patent No. 10-0423184 (Patent Literature 4), and Korean Patent No. 10-1097718 (Patent Literature 5).

DISCLOSURE

Technical Problem

However, the conventional non-contact substrate temperature measurement methods disclosed by Patent Literatures 1 to 5 use a pyrometer, and during the rapid heat treatment process, optical measurements of the pyrometer are affected by, for example, the conditions of the substrate, i.e., emissivity as a function of temperature, geometric structure characteristics of the chamber, spectrum wavelength of the pyrometer, and the type and thickness of a film formed on the substrate.

Thus, the conventional non-contact substrate temperature measurement methods have low accuracy in real-time temperature measurement of the substrate, for example, a wafer that is being rotated, failing to precisely perform the rapid heat treatment process. In addition, the use of the pyrometer that is more expensive than a thermocouple makes it difficult to reduce the production cost of the rapid heat treatment apparatus.

Therefore, the present disclosure is aimed at measuring the temperature of a substrate in a non-contact rapid heat treatment apparatus accurately in real time.

The present disclosure is further aimed at reducing the production cost of the non-contact rapid heat treatment apparatus.

Technical Solution

A rapid heat treatment apparatus according to an embodiment of the present disclosure includes a chamber for rapid heat treatment, a support stage which is placed at an inner lower part of the chamber and supports and rotates a substrate for rapid heat treatment, a heat source device which is placed at an inner upper part of the chamber and radiates light to rapidly heat the substrate for rapid heat treatment, a substrate for temperature measurement which is placed apart at a distance above a part of the substrate for rapid heat treatment, and is made of a same material as the substrate for rapid heat treatment, a thermocouple for temperature measurement which is installed at the substrate for temperature measurement to measure a temperature of the substrate for temperature measurement, a support part of a light transmitting material which supports the substrate for temperature measurement, and a light transmitting plate which is placed between the support part and the heat source device to isolate the two internal space parts of the chamber, wherein the temperature of the substrate for temperature measurement measured by the thermocouple is regarded as temperature of the substrate for rapid heat treatment.

The support part may be a plate having a hollow for inserting the substrate for temperature measurement.

The support part may be a plate having an opening above the hollow, or a plate having an opening above the hollow and an opening below the hollow.

The substrate for temperature measurement may be adhered to the support part with a high-temperature adhesive.

The support part may be a plate having hollows for inserting one or more substrates for temperature measurement.

The support part may be a plate having a sector-shaped hollow for inserting a sector-shaped substrate for temperature measurement.

The support part may have an upper horizontal protrusion and a lower horizontal protrusion spaced apart at a distance to support the substrate for temperature measurement with a part of an edge of the substrate for temperature measurement inserted therebetween, and a vertical part integrally connected to the upper horizontal protrusion and the lower horizontal protrusion.

The thermocouple may include one or more thermocouples, each thermocouple having a contact point which is inserted into a corresponding through-hole of the substrate for temperature measurement and a wire integrally connected to the contact point, or the thermocouple may include one or more thermocouples, each thermocouple having a contact point which is inserted into a corresponding groove of the substrate for temperature measurement and a wire integrally connected to the contact point.

The wire may be placed apart at a distance above an upper surface of the substrate for temperature measurement, or may be placed in a guide groove formed on an upper surface of the substrate for temperature measurement.

A groove for receiving the substrate for temperature measurement may be formed at a center of an upper surface of the support part.

Advantageous Effects

According to the rapid heat treatment apparatus of the present disclosure, it is possible to accurately measure the temperature of a substrate for rapid heat treatment in the apparatus for non-contact rapid heat treatment and reduce the production cost of the rapid heat treatment apparatus.

BEST MODE

Hereinafter, a rapid heat treatment apparatus according to the present disclosure will be described in detail with reference to the accompanying drawings. Hereinafter, like symbols are given to like or equivalent elements throughout the drawings and overlapping description is omitted herein.

Figure 1:
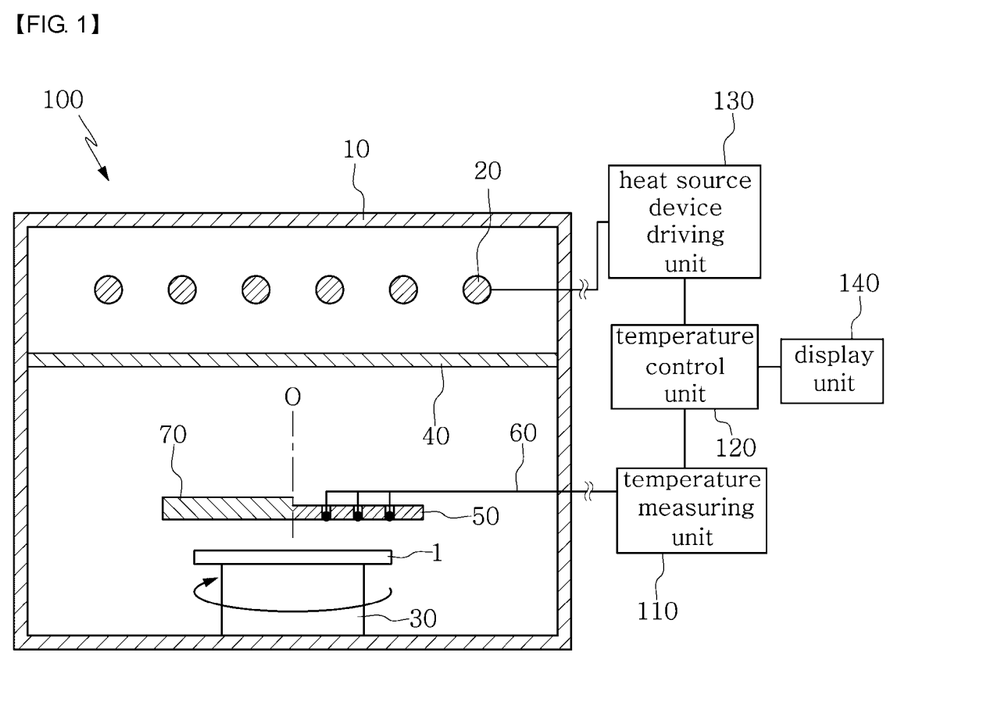
FIG. 1 is a configuration diagram schematically showing a rapid heat treatment apparatus according to an embodiment of the present disclosure.

FIG. 1 is a configuration diagram schematically showing a rapid heat treatment apparatus according to an embodiment of the present disclosure.

As shown in FIG. 1, the rapid heat treatment apparatus 100 according to an embodiment of the present disclosure includes a chamber 10, a heat source device 20, a wafer support stage 30, a light transmitting plate 40, a wafer 50 for temperature measurement, a thermocouple 60 for temperature measurement, and a support part 70.

Here, the chamber 10 is a container, for example, an approximately cylindrical or rectangular container having a closed space for performing a rapid heat treatment process, and isolates the space inside of the chamber 10 from air outside of the chamber 10 to uniformly maintain an atmosphere for performing a rapid heat treatment process and protect a wafer 1 for rapid heat treatment in the chamber 10 from pollutants in air.

The heat source device 20 is a light source that is placed at a part, for example, an upper part of the internal space of the chamber 10 to radiate light, for example, infrared rays. The heat source device 20 radiates light from, for example, a tungsten halogen lamp to rapidly heat the wafer 1 in the chamber 10. Although not shown in the drawings, the heat source device 20 may be installed at a lower part of the internal space of the chamber 10.

The wafer support stage 30 is a part that is placed at the lower part of the internal space of the chamber 10 to horizontally support the wafer 1 in a mechanical manner, electromagnetic manner or vacuum manner. As well known, the wafer support stage 30 may horizontally rotate the wafer 1 in one direction, for example, in an arrow direction to increase uniformity of rapid heat treatment on the wafer 1.

The light transmitting plate 40 is a part that is placed between the heat source device 20 and the wafer support stage 30 to isolate two subdivisions of the internal space of the chamber 10 from each other. The light transmitting plate 40 may be made of a light transmitting material, for example, quartz, to allow light radiated from the heat source device 20 to pass through.

The support part 70 is a part that stably supports the wafer 50 for temperature measurement horizontally at a predetermined distance from the wafer 1 facing the heat source device 20. To vertically lift the wafer 50 for temperature measurement, general vertical lifting equipment (not shown) may be mechanically connected to two opposing sides of the support part 70. The support part 70 may be made of a light transmitting material, for example, quartz, to transmit light of the heat source device 20 to the wafer 1, and may be formed of, for example, an approximately circular insulating plate.

Furthermore, the support part 70 may be installed on the wall or bottom of the chamber 10 so that the wafer 50 for temperature measurement and the wafer 1 are arranged in parallel. That is, when the support part 70 is installed on the wall or bottom of the chamber 10 while supporting the wafer 50 for temperature measurement, the wafer 50 for temperature measurement and the wafer 1 will be arranged in parallel.

Furthermore, a distance between the wafer 50 for temperature measurement and the wafer 1 is preferably as short as possible to accurately measure the temperature of the wafer 1. As the distance between the wafer 50 and the wafer 1 is smaller, temperature distributions of the wafer 50 and the wafer 1 are similar. Accordingly, the wafer 50 is preferably placed at a distance that is greater than or equal to a rotation tolerance of the rotating substrate 1. In contrast, as the distance between the wafer 50 and the wafer 1 is larger, a temperature distribution difference between the wafer 50 and the wafer 1 increases, but a light loss hidden by the wafer 50 reduces.

Furthermore, the thermocouple 60 for temperature measurement as a temperature measurement medium is installed at the wafer 50 for temperature measurement to measure the temperature of the wafer 1 for rapid heat treatment. The thermocouple 60 for temperature measurement extends such that it is electrically connected to a wafer temperature measuring unit (not shown) installed outside of the chamber 10. The wafer 50 for temperature measurement may be made of the same material as the wafer 1 for rapid heat treatment, for example, silicon, glass, sapphire and SIC, and may be formed with the same thickness as the wafer 1.

The thermocouple 60 is electrically isolated from the support part 70 to convert the temperature of the wafer 50 for temperature measurement to an electrical signal and transmit the electrical signal to the temperature measuring unit 110. Furthermore, because the chamber 10 has a vacuum atmosphere inside, the support part 70 is configured to shield and separate the inside of the chamber 10 from the outside to maintain a pressure difference between the inside and the outside.

Furthermore, outside of the chamber 10, a user may assemble the wafer 50 for temperature measurement with the thermocouple 60 and the support part 70 to form an independent module.

Furthermore, in real use, the chamber 10 is cooled by a refrigerant, and the wafer 50 for temperature measurement is heated by the heat source device 20. In this instance, the inside of the chamber 10 is thermally separated from the outside to prevent heat generated from the heat source device 20 from going out of the chamber 10 through the wafer 50 for temperature measurement and the support part 70.

Furthermore, the heat treatment apparatus 100 may include a temperature measuring unit 110, a temperature control unit 120, a heat source device driving unit 130 and a display unit 140 that are installed outside of the chamber 10. The temperature measuring unit 110 measures the temperature of the wafer 50 by medium of the thermocouple 60 and transmits a signal corresponding to the temperature of the wafer 50 to the temperature control unit 120. The temperature control unit 120 receives the signal corresponding to the temperature of the wafer 50 from the temperature measuring unit 110 and controls to drive the heat source device driving unit 130 or display the display unit 140. The heat source device driving unit 130 may drive the heat source device 20 by control of the temperature control unit 120 to supply power to the heat source device 20 so as to obtain a desired temperature of the wafer 1. The display unit 140 may display information including the temperature of the wafer 50 by control of the temperature control unit 120.

Furthermore, although not shown in the drawings, a gas supply unit is installed outside of the chamber 10 to supply gas for rapid heat treatment into the chamber 10, and the body of the chamber 10 has a gas inlet through which the gas for rapid heat treatment process supplied by the gas supply unit is injected into the chamber 10, and a gas outlet through which the gas used in the rapid heat treatment process is discharged out of the chamber 10. Of course, it is obvious that a central control unit is provided to control the operation of each known element of the rapid heat treatment apparatus including the gas supply unit.

Meanwhile, for convenience of description, the present disclosure uses the wafer 50 for temperature measurement and the wafer 1 for rapid heat treatment, but the present disclosure is not limited thereto and may use a substrate for temperature measurement and a substrate for rapid heat treatment of various materials or shapes.

The rapid heat treatment apparatus of the present disclosure configured as described above may measure the temperature of the wafer 50 by bringing the thermocouple 60 into contact with the wafer 50 of the same material as the wafer 1, and regard the measured temperature value of the wafer 50 as a measured temperature value of the wafer 1. Accordingly, the present disclosure can accurately measure the temperature of the wafer 1 using the thermocouple 60 without contacting the wafer 1. Furthermore, the present disclosure uses the thermocouple that is lower priced than an expensive pyrometer, thereby reducing the production cost of the rapid heat treatment apparatus.

Figure 2:
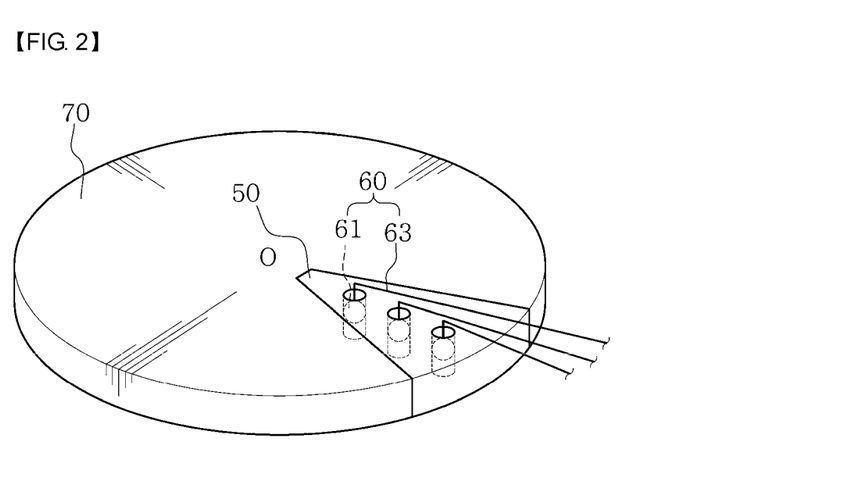
FIG. 2 is a diagram showing an example in which a wafer for temperature measurement is supported on a support part of a rapid heat treatment apparatus according to an embodiment of the present disclosure.
Figure 3:
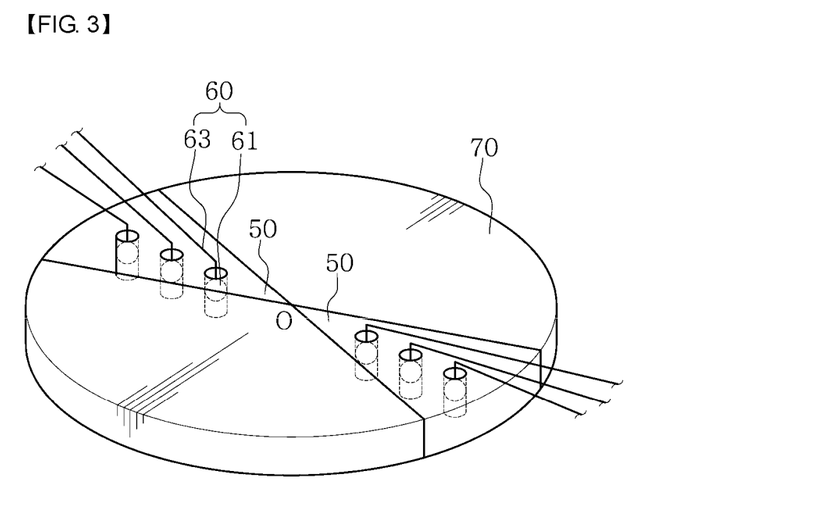
FIG. 3 is a diagram showing another example in which a wafer for temperature measurement is supported on a support part of a rapid heat treatment apparatus according to an embodiment of the present disclosure.

FIG. 2 is a diagram showing an example in which the wafer for temperature measurement is supported on the support part of the rapid heat treatment apparatus according to an embodiment of the present disclosure, and FIG. 3 is a diagram showing another example in which the wafer for temperature measurement is supported on the support part of the rapid heat treatment apparatus according to an embodiment of the present disclosure.

As shown in FIG. 2, a part of the support part 70 has a hollow, for example, an approximately sector shaped hollow (71 in FIGS. 10 to 12) having the increasing width between two sides toward the outer circumferential surface of the support part 70 in a radial direction from the proximity of the center O of the support part 70. The wafer 50 for temperature measurement in approximately sector shape having approximately same size as the hollow of the support part 70 is inserted into the hollow. Likewise, as shown in FIG. 3, the support part 70 may have two hollows that are symmetrically formed 180 degrees apart, and the wafer 50 is inserted into each hollow.

Furthermore, as shown in FIGS. 2 and 3, contact points 61 of multiple thermocouples 60, for example, three thermocouples 60 are arranged in a line at a preset interval toward the outer circumferential surface of the wafer 50 in a radial direction from the proximity of the center O of the support part 70 on the upper surface of each wafer 50. The wires 63 of each thermocouple 60 extend such that they are electrically connected to the corresponding contact points 61.

Here, the larger size of the wafer 50, the wider area of the wafer 1 where light of the heat source device 20 is intercepted by the wafer 50 and the poorer temperature uniformity over the entire area of the wafer 1, and thus, taking installation possibility of the thermocouple 60 into account, preferably the wafer 50 is smaller than the wafer 1 as much as possible and the inner end of the wafer 50 adjacent to the center O has a width that is as minimum as possible.

Furthermore, to prevent a corresponding point of the wafer 1 disposed immediately below the center O of the support part 70 from being always hidden by the rotating wafer 50, the inner end of the wafer 50 is spaced apart at a predetermined distance, for example, 10 mm or more, outwards in a radial direction from the center O. To reduce the temperature difference between the wafer 50 and the wafer 1, preferably the outer end of the wafer 50 extends to the outer end of the wafer 1.

Meanwhile, although it is shown that two wafers 50 for temperature measurement are installed at the support part 70, more than two wafers 50 for temperature measurement may be installed at the support part 70. Furthermore, although it is shown that three contact points 61 are arranged at a preset interval toward the outer circumferential surface of the wafer 50 in a radial direction from the center O of the support part 70, one, two or more than three contact points 61 may be arranged on the wafer 50. Furthermore, the hollow of the support part 70 and the wafer 50 may be formed in a variety of feasible shapes including a sector as well as a rectangle.

Figure 4:
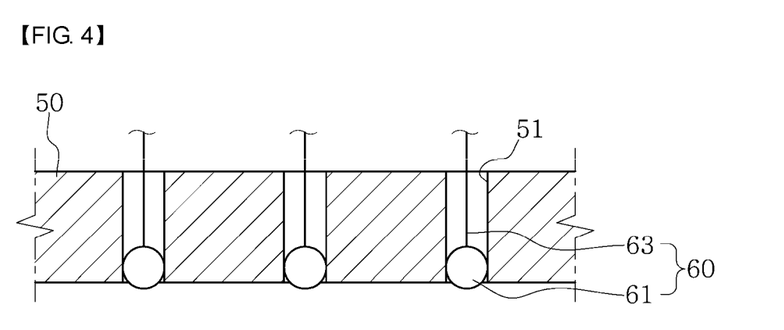
FIG. 4 is a diagram showing an example in which contact points of thermocouples for temperature measurement are placed in though-holes of a wafer for temperature measurement of a rapid heat treatment apparatus according to an embodiment of the present disclosure.
Figure 5:
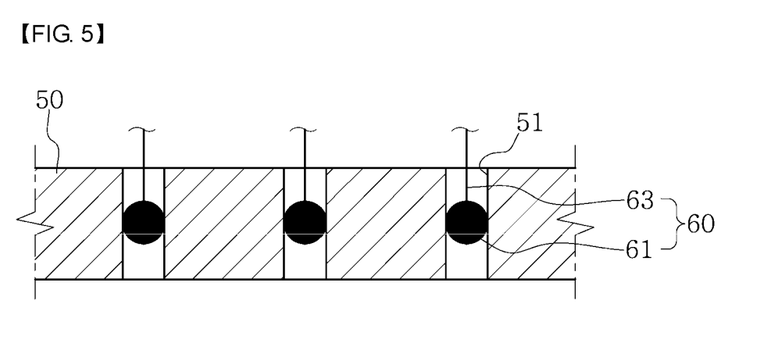
FIG. 5 is a diagram showing another example in which contact points of thermocouples for temperature measurement are placed in though-holes of a wafer for temperature measurement of a rapid heat treatment apparatus according to an embodiment of the present disclosure.

FIG. 4 is a diagram showing an example in which the contact points of the thermocouples for temperature measurement are placed in though-holes of the wafer for temperature measurement of the rapid heat treatment apparatus according to an embodiment of the present disclosure, and FIG. 5 is a diagram showing another example in which the contact points of the thermocouples for temperature measurement are placed in though-holes of the wafer for temperature measurement of the rapid heat treatment apparatus according to an embodiment of the present disclosure.

As shown in FIGS. 4 and 5, each thermocouple 60 has the spherical contact points 61 with approximately the same diameter. The diameter of a through-hole 51, for example, a circular through-hole of the wafer 50 is approximately the same as the diameter of the contact point 61. Each contact point 61 is inserted into the corresponding through-hole 51 of the wafer 50, and each wire 63 is integrally connected to the corresponding contact point 61 and extends outward through an upper opening of the through-hole 51 facing the heat source device 20 shown in FIG. 1. When the depth of the through-hole 51 is greater than the diameter of the contact point 61, a part of the contact point 61 may be, as shown in FIG. 4, positioned at a lower location than a lower opening of the through-hole 51 facing the wafer 1 shown in FIG. 1, or the whole contact point 61 may be, as shown in FIG. 5, positioned at a higher location than the lower opening of the through-hole 51.

Meanwhile, as shown in the drawings, the upper part of the contact point 61 may be exposed, or although not shown in the drawings, the upper part of the contact point 61 may be covered with a high-temperature adhesive or a slice of wafer of the same material as the wafer 50.

Figure 6:
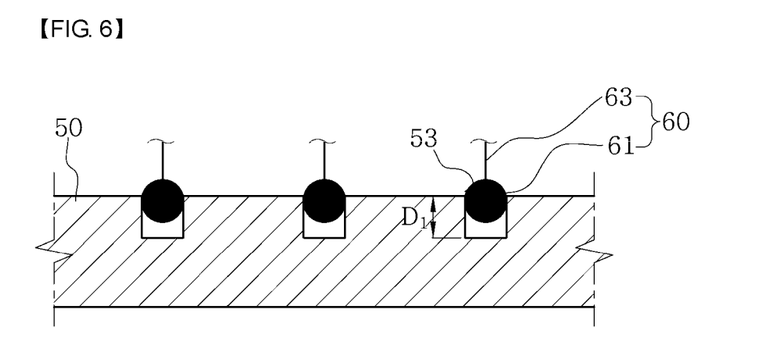
FIG. 6 is a diagram showing an example in which contact points of thermocouples for temperature measurement are placed in grooves of a wafer for temperature measurement of a rapid heat treatment apparatus according to an embodiment of the present disclosure.
Figure 7:
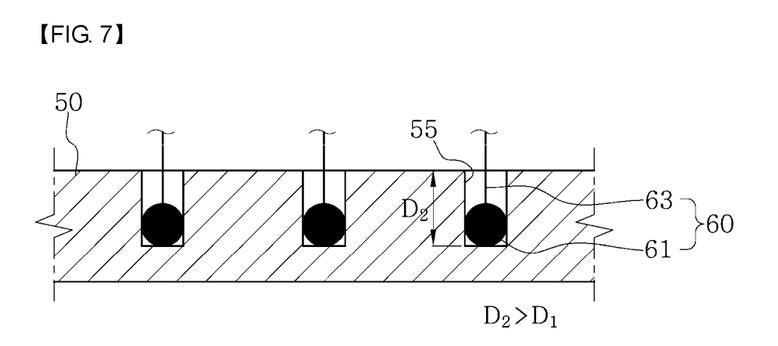
FIG. 7 is a diagram showing another example in which contact points of thermocouples for temperature measurement are placed in grooves of a wafer for temperature measurement of a rapid heat treatment apparatus according to an embodiment of the present disclosure.

FIG. 6 is a diagram showing an example in which the contact points of the thermocouples for temperature measurement are placed in grooves of the wafer for temperature measurement of the rapid heat treatment apparatus according to an embodiment of the present disclosure, and FIG. 7 is a diagram showing another example in which the contact points of the thermocouples for temperature measurement are placed in grooves of the wafer for temperature measurement of the rapid heat treatment apparatus according to an embodiment of the present disclosure.

As shown in FIGS. 6 and 7, each thermocouple 60 has the spherical contact points 61 with approximately the same diameter. The diameter of grooves 53, 55, for example, circular grooves, of the wafer 50 is approximately the same as the diameter of the contact point 61. The contact points 61 are each inserted into the corresponding grooves 53, 55 of the wafer 50, and each wire 63 is integrally connected to the corresponding contact point 61 and extends outwards through upper openings of the grooves 53, 55 facing the heat source device 20 shown in FIG. 1. When the depth D2 of the groove 55 facing the heat source device 20 shown in FIG. 1 is deeper than the depth D1 of the groove 53, and the depth D1 of the groove 53 is smaller than the diameter of the contact point 61, the upper part of the contact point 61 may be, as shown in FIG. 6, positioned at a higher location than the entrance of the groove 53, or the upper part of the contact point 61 may be, as shown in FIG. 7, positioned at a lower location than the entrance of the groove 55.

Meanwhile, as shown in the drawings, the upper part of the contact point 61 may be exposed, or although not shown in the drawings, the upper part of the contact point 61 may be covered with a high-temperature adhesive or a slice of wafer of the same material as the wafer 50.

Figure 8:
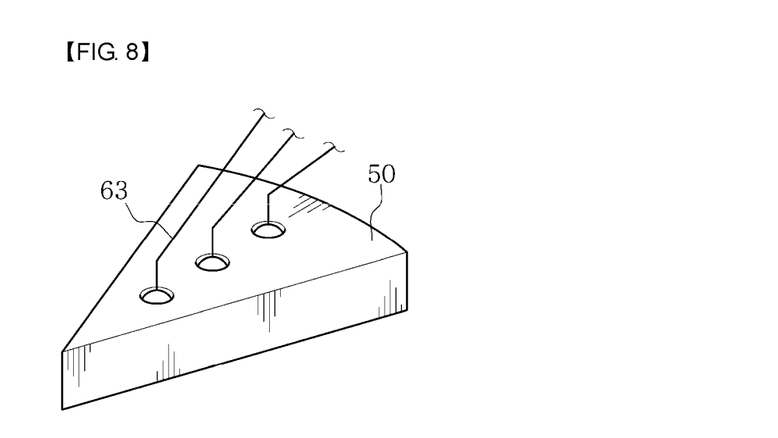
FIG. 8 is a diagram showing an example in which wires of thermocouples for temperature measurement of a rapid heat treatment apparatus according to an embodiment of the present disclosure are placed over a wafer for temperature measurement.
Figure 9:
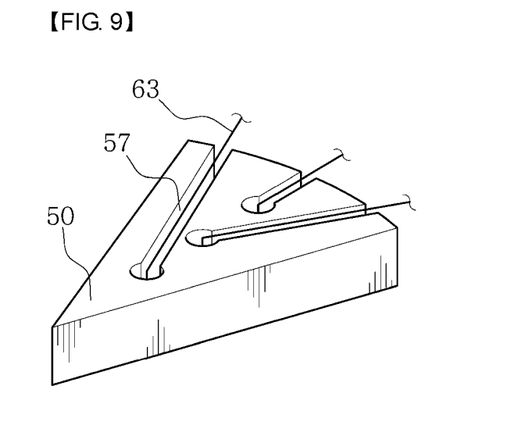
FIG. 9 is a diagram showing another example in which wires of thermocouples for temperature measurement of a rapid heat treatment apparatus according to an embodiment of the present disclosure are placed over a wafer for temperature measurement.

FIG. 8 is a diagram showing an example in which the wires of the thermocouples for temperature measurement of the rapid heat treatment apparatus according to an embodiment of the present disclosure are placed on the wafer for temperature measurement, and FIG. 9 is a diagram showing another example in which the wires of the thermocouples for temperature measurement of the rapid heat treatment apparatus according to an embodiment of the present disclosure is placed on the wafer for temperature measurement.

As shown in FIG. 8, the wires 63 of the thermocouples may be spaced apart at a predetermined distance above the upper surface of the wafer 50 to prevent them from directly contacting the upper surface of the wafer 50.

Furthermore, the wafer 50 for temperature measurement may be formed in a sector shape as shown in FIG. 8. However, the shape of the wafer 50 for temperature measurement is not limited thereto. For example, the wafer 50 for temperature measurement may be formed in a rectangular shape.

As shown in FIG. 9, to guide the wires 63 of the thermocouples, the wires 63 may be placed in guide grooves 57 of the wafer 50. The guide grooves 57 are formed on the upper surface of the wafer 50 to guide the wires 63 in a radial direction of the wafer 50 along preset extension paths, and extend such that they communicate with the through-holes 51 or the grooves 53, 55 shown in FIGS. 4 to 7 in a one-to-one relationship. In case that a part of the wire 63 placed along the guide groove 57 comes into contact with the wafer 50, when the wafer 50 is in high temperature, the corresponding part of the wire 63 reacts with the wafer 50, for example, a silicon wafer, to form an alloy and may melt and be broken. Accordingly, the wire 63 is preferably adhered to the guide groove 57 with a high-temperature adhesive (not shown) to prevent the direct contact between the wire 63 and the wafer 50.

Meanwhile, to help the understanding of description for convenience of description, although the wire 63 is shown as one wire for each thermocouple 60, the wire may actually comprise two wires of different materials, for example, a wire of alumel material and a wire of chromel material, or another material, and front ends of the two wires are only joined to the contact points of the thermocouples. To prevent parts of the two wires except contact points from contacting each other, the two wires may be mechanically spaced apart or the two wires may be covered with a protective film of an insulating material such as quartz or ceramic.

Figure 10:
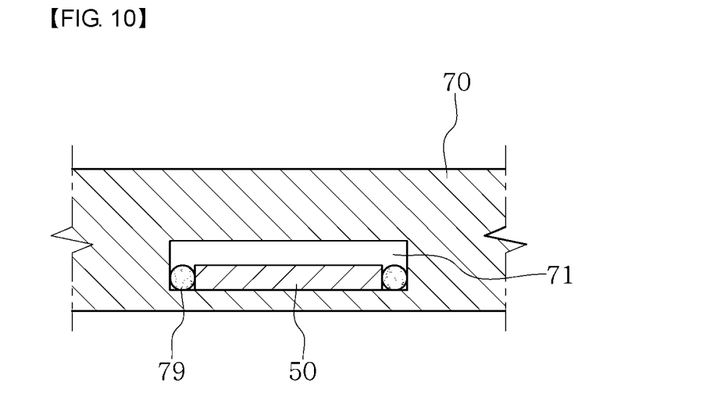
FIGS. 10 to 12 are each cross-sectional views showing a cross-sectional structure of a support part of a rapid heat treatment apparatus according to an embodiment of the present disclosure.
Figure 11:
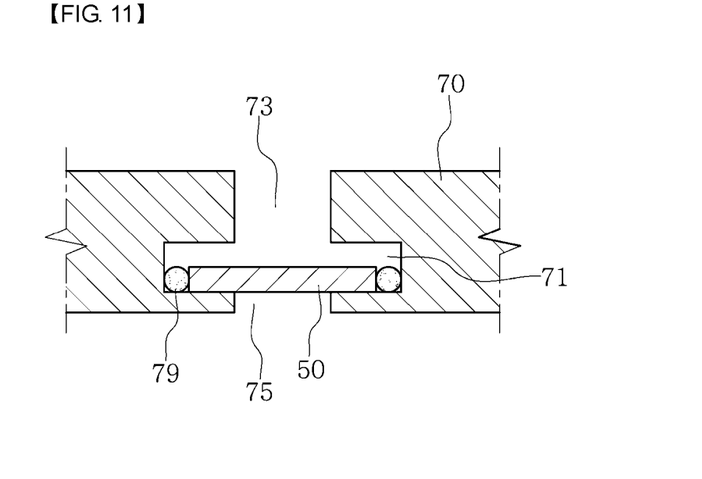
Figure 12:
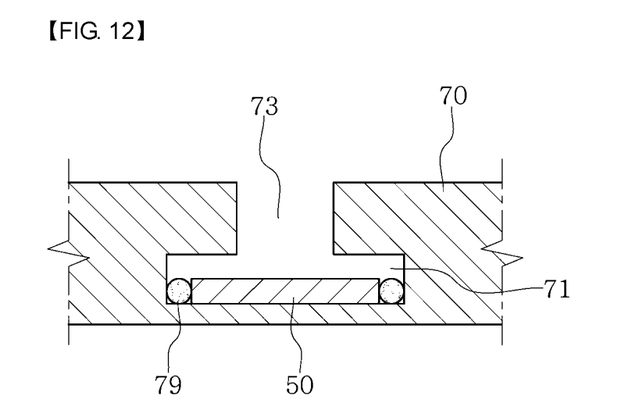

FIGS. 10 to 12 are each cross-sectional views showing a cross-sectional structure of the support part of the rapid heat treatment apparatus according to an embodiment of the present disclosure.

As shown in FIGS. 10 to 12, a hollow 71 is formed inside the support part 70. The hollow 71 has an empty space in which the wafer 50 is accommodated, and may be formed in the same shape as the wafer 50 described in FIG. 2 or 3.

Furthermore, an upper opening and a lower opening that communicates with the hollow 71 may be all closed as shown in FIG. 10, the upper opening 73 and the lower opening 75 may be respectively formed in partial areas above and below the hollow 71 as shown in FIG. 11, or only the upper opening 73 may be formed in a partial area above the hollow 71 as shown in FIG. 12.

Furthermore, in order to accurately measure the temperature of the wafer 1 shown in FIG. 1, the body of the support part 70 disposed under the wafer 50 is preferably formed with a thickness that is as thin as possible to reduce the distance between the wafer 50 and the wafer 1.

Meanwhile, although not shown in the drawings, for stable support of the wafer 50, parts of the wafer 50, for example, two opposing side edges may be adhered to the corresponding parts of the support part 70, for example, with a high-temperature adhesive 79. For stable support of the wafer 50 and preventing the contact between the wafer 50 and the support part 70, the lower surface of the two opposing sides of the wafer 50 may be supported on the corresponding parts of the support part 70 by a mechanical engagement method of concavo-convex structure.

Figure 13:
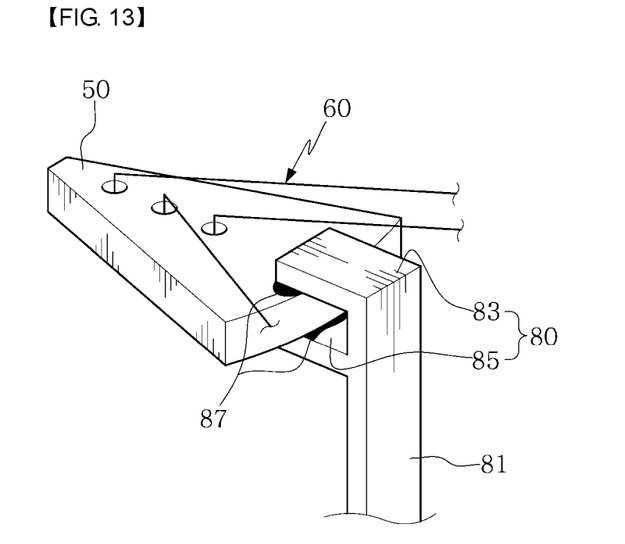
FIG. 13 is a diagram showing an example in which a wafer for temperature measurement is supported on another support part of a rapid heat treatment apparatus according to an embodiment of the present disclosure.

FIG. 13 is a diagram showing an example in which the wafer for temperature measurement is supported on another support part of the rapid heat treatment apparatus according to an embodiment of the present disclosure.

As shown in FIG. 13, the support part 80 is one support that may replace the support part 70 shown in FIGS. 2 and 3, and has a vertical part 81, an upper horizontal protrusion 83, and a lower horizontal protrusion 85.

Here, the vertical part 81 may be made of a light transmitting material, for example, quartz, and is a member that extends vertically. The upper horizontal protrusion 83 and the lower horizontal protrusion 85 are integrally connected to the vertical part 81 and made of a light transmitting material, for example, quartz, and the upper horizontal protrusion 83 and the lower horizontal protrusion 85 extend horizontally facing each other spaced apart at a predetermined distance in higher and lower positions to support the wafer 50 for temperature measurement with a part of the outer edge of the wafer 50 for temperature measurement inserted between the upper horizontal protrusion 83 and the lower horizontal protrusion 85, wherein the outer edge of the wafer 50 for temperature measurement is wider than the inner edge of the wafer 50 for temperature measurement positioned adjacent to the center O of FIG. 1. Furthermore, for stable support of the wafer 50, the upper horizontal protrusion 83 and the lower horizontal protrusion 85 may be respectively adhered to the upper surface and the lower surface of the wafer 50 with the high-temperature adhesive 87. To vertically lift the wafer 50 for temperature measurement, general vertical lifting equipment (not shown) may be mechanically connected to the bottom of the vertical part 81.

Furthermore, outside of the chamber 10, the user may assemble the wafer 50 for temperature measurement with the thermocouple 60 and the support part 80 to form an independent module.

Meanwhile, although not shown in the drawings, two or more support parts 80 may be installed horizontally spaced apart from each other, and similar to the support part 70, to vertically lift the wafer 50 for temperature measurement, general vertical lifting equipment (not shown) may be connected to the vertical part 81 of the support part 80 by various engagement methods. Of course, it is obvious that the support part 80 is not limited to the shown structure, and may be formed with various structures if it can stably support the wafer 50.

In another example, the support part 80 may include a rectangular plate having a predetermined groove to provide a space for accommodating the high-temperature adhesive 87 and the wafer 50 for temperature measurement. That is, the wafer 50 for temperature measurement is inserted into the groove that is dented inward from one surface of the plate, and the high-temperature adhesive 87 is placed in a gap between the wafer 50 for temperature measurement inserted into the groove and the plate. Accordingly, the high-temperature adhesive 87 may thermally or electrically shield the wafer 50 for temperature measurement from the plate. In this instance, the plate is electrically isolated from the thermocouple 60, and shields the inside of the chamber 10 from the outside, thereby maintaining a pressure difference between the inside of the chamber and the outside.

The wafer 50 for temperature measurement may be formed in a sector shape as well as a rectangular shape. Furthermore, the high-temperature adhesive 87 is made of a material such as ceramic, glass or quartz to thermally or electrically shield the wafer 50 for temperature measurement from the plate. In addition, the chamber 10 is made of SUS or Al material, and the plate may be made of the same material as the chamber 10.

Figure 14:
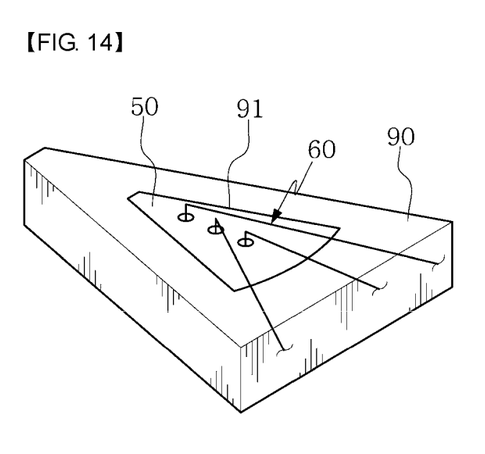
FIG. 14 is a diagram showing an example in which a wafer for temperature measurement is supported on still another support part of a rapid heat treatment apparatus according to an embodiment of the present disclosure.

FIG. 14 is a diagram showing an example in which the wafer for temperature measurement is supported on still another support part of the rapid heat treatment apparatus according to an embodiment of the present disclosure.

As shown in FIG. 14, the support part 90 is one support that may replace the support part 70 shown in FIGS. 2 and 3, and has the outer edge that is wider than the inner edge adjacent to the center O of FIG. 1, and may be made of a light transmitting material, for example, quartz. A groove 91 for receiving the wafer 50 for temperature measurement is formed at the center of the upper surface of the support part 90.

Furthermore, the groove 91 has the outer edge that is wider than the inner edge adjacent to the center O of FIG. 1, and may have a step (not shown) on the inner surface to situate the wafer 50 for temperature measurement. For stable support of the wafer 50, the wafer 50 may be adhered to the step of the groove 91, for example, with a high-temperature adhesive (not shown).

Meanwhile, although not shown in the drawings, two or more support parts 90 may be installed horizontally spaced apart from each other. To vertically lift the wafer 50 for temperature measurement, general vertical lifting equipment may be connected to the outer edge of the support part 90 by various engagement methods. Of course, it is obvious that the support part 90 is not limited to the approximately triangular plate structure as shown and may be formed with structures of various shapes if it can stably support the wafer 50.

In the case of the rapid heat treatment apparatus 100 according to the present disclosure configured as described above, the wafer 1 is supported on the wafer support stage 30, and the wafer 50 for temperature measurement is supported spaced apart at a predetermined distance above the wafer 1 by the support part 70, 80, and with the horizontal rotation of the wafer support stage 30, the wafer 1 rotates horizontally, and when light from the heat source device 20 is irradiated onto the wafer 1, the wafer 1 and the wafer 50 are rapidly heated.

In this instance, because the wafer 1 and the wafer 50 are made of the same material, the temperature of the wafer 50 measured by the thermocouple 60 is found to be almost the same as the real temperature of the wafer 1. Accordingly, it is possible to accurately measure the temperature of the wafer 1 in a non-contact manner in real time.

Furthermore, to make the temperature of the wafer 50 measured by the thermocouple 60 have exactly the same value as the real temperature of the wafer 1, the control unit may be implemented in software to determine a very small temperature difference between the temperature of the wafer 50 measured by the thermocouple 60 and the real temperature of the wafer 1 based on the distance between the wafer 50 and the wafer 1 through simulation or real experiments, and reflect the temperature difference on the measured temperature of the wafer 50, making it possible to measure the temperature of the wafer 1 more accurately in real time.

Furthermore, because the wafer 50 for temperature measurement is stably supported by the support part 70, 80, the thermocouple 60 can be also stably supported. Accordingly, it is possible to measure the temperature of the wafer accurately.

Furthermore, because the thermocouple is used to measure the temperature of the wafer in place of an expensive pyrometer, it is possible to reduce the production cost of the rapid heat treatment apparatus.

As described above, using the rapid heat treatment apparatus according to the present disclosure, it is possible to ensure temperature uniformity over the entire area of the large scale substrate, and accurately measure the temperature of the substrate in real time due to a remarkably reduced difference between the set temperature and the real substrate temperature compared to earlier technology.

While the embodiments according to the present disclosure have been hereinabove described with reference to the drawings, the detailed configuration is not limited to these embodiments, and the present disclosure covers design modification made without departing from the essence of the present disclosure.

According to the present disclosure, it is possible to measure the temperature of the substrate in the rapid heat treatment apparatus accurately in real time, and reduce the production cost of the non-contact rapid heat treatment apparatus.

Furthermore, the rapid heat treatment apparatus according to the present disclosure can be used in an impurity diffusion process, a back surface field formation process, and an electrode sintering process of solar cells. Furthermore, it can be used in a heat treatment process of gas sensor electrode materials. Furthermore, it can be used in a heat treatment process of various types of single or complex materials including metal, metal oxide film, ceramic, glass, quartz and polymer.

The invention claimed is:

1. A rapid heat treatment apparatus, comprising:
   a chamber for rapid heat treatment;
   a support stage which is disposed on an lower inner side of the chamber and supports and rotates a substrate for rapid heat treatment;
   a heat source device which is disposed on an upper inner side of the chamber and radiates light to rapidly heat the substrate for rapid heat treatment;
   a substrate for temperature measurement which is placed apart at a distance above a part of the substrate for rapid heat treatment, and is made of a same material as the substrate for rapid heat treatment;
   a thermocouple for temperature measurement which is installed at the substrate for temperature measurement to measure a temperature of the substrate for temperature measurement;
   a support part of a light transmitting material which supports the substrate for temperature measurement; and
   a light transmitting plate which is disposed between the support part and the heat source device to isolate the two internal space parts of the chamber,
   wherein the temperature of the substrate for temperature measurement measured by the thermocouple is regarded as temperature of the substrate for rapid heat treatment.

2. The rapid heat treatment apparatus according to claim 1, wherein the support part is a plate having a hollow for inserting the substrate for temperature measurement.

3. The rapid heat treatment apparatus according to claim 2, wherein the support part is a plate having an opening above the hollow.

4. The rapid heat treatment apparatus according to claim 2, wherein the support part is a plate having an opening above the hollow and an opening below the hollow.

5. The rapid heat treatment apparatus according to claim 2, wherein the substrate for temperature measurement is adhered to the support part with a high-temperature adhesive.

6. The rapid heat treatment apparatus according to claim 2, wherein the support part is a plate having hollows for inserting one or more substrates for temperature measurement.

7. The rapid heat treatment apparatus according to claim 2, wherein the support part is a plate having a sector-shaped hollow for inserting a sector-shaped substrate for temperature measurement.

8. The rapid heat treatment apparatus according to claim 1, wherein the support part comprises an upper horizontal protrusion and a lower horizontal protrusion spaced apart at a distance to support the substrate for temperature measurement with a part of an edge of the substrate for temperature measurement inserted therebetween, and a vertical part integrally connected to the upper horizontal protrusion and the lower horizontal protrusion.

9. The rapid heat treatment apparatus according to claim 1, wherein the thermocouple comprises one or more thermocouples, and each thermocouple has a contact point which is inserted into a corresponding through-hole of the substrate for temperature measurement, and a wire integrally connected to the contact point.

10. The rapid heat treatment apparatus according to claim 1, wherein the thermocouple comprises one or more thermocouples, and each thermocouple has a contact point which is inserted into a corresponding groove of the substrate for temperature measurement, and a wire integrally connected to the contact point.

11. The rapid heat treatment apparatus according to claim 9, wherein the wire is placed apart at a distance above an upper surface of the substrate for temperature measurement.

12. The rapid heat treatment apparatus according to claim 9, wherein the wire is placed in a guide groove formed on an upper surface of the substrate for temperature measurement.

13. The rapid heat treatment apparatus according to claim 1, wherein a groove for receiving the substrate for temperature measurement is formed at a center of an upper surface of the support part.

14. The rapid heat treatment apparatus according to claim 10, wherein the wire is placed apart at a distance above an upper surface of the substrate for temperature measurement.

15. The rapid heat treatment apparatus according to claim 10, wherein the wire is placed in a guide groove formed on an upper surface of the substrate for temperature measurement.

* * * * *